United States Patent
Lung

(10) Patent No.: US 7,432,206 B2
(45) Date of Patent: Oct. 7, 2008

(54) SELF-ALIGNED MANUFACTURING METHOD, AND MANUFACTURING METHOD FOR THIN FILM FUSE PHASE CHANGE RAM

(75) Inventor: Hsiang Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 103 days.

(21) Appl. No.: 11/338,285

(22) Filed: Jan. 24, 2006

(65) Prior Publication Data

US 2007/0173063 A1    Jul. 26, 2007

(51) Int. Cl.
*H01L 21/311* (2006.01)

(52) U.S. Cl. .................. 438/700; 438/585; 438/694

(58) Field of Classification Search .......... 438/694, 438/700, 702, 706, 710, 712, 714, 211, 253, 438/585

See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,599,705 A | 7/1986 | Holmberg et al. | |
| 4,719,594 A | 1/1988 | Young et al. | |
| 4,876,220 A | 10/1989 | Mohsen et al. | |
| 4,959,812 A | 9/1990 | Momodomi et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| 5,515,488 A | 5/1996 | Stephens, Jr. | |
| 5,534,712 A | 7/1996 | Ovshinsky et al. | |
| 5,687,112 A | 11/1997 | Ovshinsky | |
| 5,789,277 A | 8/1998 | Zahorik et al. | |
| 5,789,758 A | 8/1998 | Reinberg | |
| 5,814,527 A | 9/1998 | Wolstenholme et al. | |

(Continued)

FOREIGN PATENT DOCUMENTS

WO    WO 00/45108 A1    8/2000

(Continued)

OTHER PUBLICATIONS

Adler, David, "Amorphous-Semiconductor Devices," Sci. Amer., vol. 236, pp. 36-48, May 1977.

(Continued)

*Primary Examiner*—Kin-Chan Chen
(74) *Attorney, Agent, or Firm*—Haynes Beffel & Wolfeld LLP

(57) ABSTRACT

A method for manufacturing a self aligned narrow structure over a wider structure based on mask trimming. A method for manufacturing a memory device comprises forming an electrode layer on a substrate which comprises circuitry made using front-end-of-line procedures. The electrode layer includes a first electrode and a second electrode, and an insulating member between the first and second electrodes for each phase change memory cell to be formed. A patch of memory material is formed on the top surface of the electrode layer across the insulating member for each memory cell to be formed. The patch and the first and second electrodes are formed using a self-aligned process based on mask trimming.

15 Claims, 6 Drawing Sheets

U.S. PATENT DOCUMENTS

| | | | |
|---|---|---|---|
| 5,831,276 | A | 11/1998 | Gonzalez et al. |
| 5,837,564 | A | 11/1998 | Sandhu et al. |
| 5,869,843 | A | 2/1999 | Harshfield |
| 5,879,955 | A | 3/1999 | Gonzalez et al. |
| 5,902,704 | A * | 5/1999 | Schoenborn et al. ........... 430/5 |
| 5,920,788 | A | 7/1999 | Reinberg |
| 5,952,671 | A | 9/1999 | Reinberg et al. |
| 5,958,358 | A | 9/1999 | Tenne et al. |
| 5,970,336 | A | 10/1999 | Wolstenholme et al. |
| 5,985,698 | A | 11/1999 | Gonzalez et al. |
| 5,998,244 | A | 12/1999 | Wolstenholme et al. |
| 6,011,725 | A | 1/2000 | Eitan |
| 6,025,220 | A | 2/2000 | Sandhu |
| 6,031,287 | A | 2/2000 | Harshfield |
| 6,034,882 | A | 3/2000 | Johnson et al. |
| 6,066,870 | A | 5/2000 | Siek |
| 6,077,674 | A | 6/2000 | Schleifer et al. |
| 6,077,729 | A | 6/2000 | Harshfield |
| 6,087,269 | A | 7/2000 | Williams |
| 6,087,674 | A | 7/2000 | Ovshinsky et al. |
| 6,104,038 | A | 8/2000 | Gonzalez et al. |
| 6,111,264 | A | 8/2000 | Wolstenholme et al. |
| 6,114,713 | A | 9/2000 | Zahorik |
| 6,117,720 | A | 9/2000 | Harshfield |
| 6,147,395 | A | 11/2000 | Gilgen |
| 6,150,253 | A | 11/2000 | Doan et al. |
| 6,153,890 | A | 11/2000 | Wolstenholme et al. |
| 6,177,317 | B1 | 1/2001 | Huang et al. |
| 6,185,122 | B1 | 2/2001 | Johnson et al. |
| 6,189,582 | B1 | 2/2001 | Reinberg et al. |
| 6,236,059 | B1 | 5/2001 | Wolstenholme et al. |
| RE37,259 | E | 7/2001 | Ovshinsky |
| 6,271,090 | B1 | 8/2001 | Huang et al. |
| 6,280,684 | B1 | 8/2001 | Yamada et al. |
| 6,287,887 | B1 | 9/2001 | Gilgen |
| 6,314,014 | B1 | 11/2001 | Lowrey et al. |
| 6,320,786 | B1 | 11/2001 | Chang et al. |
| 6,339,544 | B1 | 1/2002 | Chiang et al. |
| 6,351,406 | B1 | 2/2002 | Johnson et al. |
| 6,372,651 | B1 * | 4/2002 | Yang et al. .................. 438/706 |
| 6,420,215 | B1 | 7/2002 | Knall et al. |
| 6,420,216 | B1 | 7/2002 | Clevenger et al. |
| 6,420,725 | B1 | 7/2002 | Harshfield |
| 6,423,621 | B2 | 7/2002 | Doan et al. |
| 6,429,064 | B1 | 8/2002 | Wicker |
| 6,462,353 | B1 | 10/2002 | Gilgen |
| 6,483,736 | B2 | 11/2002 | Johnson et al. |
| 6,487,114 | B2 | 11/2002 | Jong et al. |
| 6,501,111 | B1 | 12/2002 | Lowrey |
| 6,511,867 | B2 | 1/2003 | Lowrey et al. |
| 6,512,241 | B1 | 1/2003 | Lai |
| 6,514,788 | B2 | 2/2003 | Quinn |
| 6,534,781 | B2 | 3/2003 | Dennison |
| 6,545,903 | B1 | 4/2003 | Wu |
| 6,555,860 | B2 | 4/2003 | Lowrey et al. |
| 6,563,156 | B2 | 5/2003 | Harshfield |
| 6,566,700 | B2 | 5/2003 | Xu |
| 6,567,293 | B1 | 5/2003 | Lowrey et al. |
| 6,579,760 | B1 | 6/2003 | Lung |
| 6,586,761 | B2 | 7/2003 | Lowrey |
| 6,589,714 | B2 | 7/2003 | Maimon et al. |
| 6,593,176 | B2 | 7/2003 | Dennison |
| 6,597,009 | B2 | 7/2003 | Wicker |
| 6,605,527 | B2 | 8/2003 | Dennison et al. |
| 6,605,821 | B1 | 8/2003 | Lee et al. |
| 6,607,974 | B2 | 8/2003 | Harshfield |
| 6,613,604 | B2 | 9/2003 | Maimon et al. |
| 6,617,192 | B1 | 9/2003 | Lowrey et al. |
| 6,620,715 | B1 * | 9/2003 | Blosse et al. ................ 438/585 |
| 6,621,095 | B2 | 9/2003 | Chiang et al. |
| 6,627,530 | B2 | 9/2003 | Li et al. |
| 6,639,849 | B2 | 10/2003 | Takahashi et al. |
| 6,673,700 | B2 | 1/2004 | Dennison et al. |
| 6,744,088 | B1 | 6/2004 | Dennison |
| 6,791,102 | B2 | 9/2004 | Johnson et al. |
| 6,797,979 | B2 | 9/2004 | Chiang et al. |
| 6,800,504 | B2 | 10/2004 | Li et al. |
| 6,800,563 | B2 | 10/2004 | Xu |
| 6,808,991 | B1 * | 10/2004 | Tung .......................... 438/275 |
| 6,815,704 | B1 | 11/2004 | Chen |
| 6,830,952 | B2 | 12/2004 | Lung et al. |
| 6,850,432 | B2 | 2/2005 | Lu et al. |
| 6,859,389 | B2 | 2/2005 | Idehara et al. |
| 6,861,267 | B2 | 3/2005 | Xu et al. |
| 6,864,500 | B2 | 3/2005 | Gilton |
| 6,864,503 | B2 | 3/2005 | Lung |
| 6,867,638 | B2 | 3/2005 | Saiki et al. |
| 6,888,750 | B2 | 5/2005 | Walker et al. |
| 6,894,305 | B2 | 5/2005 | Yi et al. |
| 6,903,362 | B2 | 6/2005 | Wyeth et al. |
| 6,909,107 | B2 | 6/2005 | Rodgers et al. |
| 6,927,410 | B2 | 8/2005 | Chen |
| 6,933,516 | B2 | 8/2005 | Xu |
| 6,936,840 | B2 | 8/2005 | Sun et al. |
| 6,937,507 | B2 | 8/2005 | Chen |
| 6,972,430 | B2 | 12/2005 | Casagrande et al. |
| 6,992,932 | B2 | 1/2006 | Cohen |
| 7,023,009 | B2 | 4/2006 | Kostylev et al. |
| 7,033,856 | B2 | 4/2006 | Lung et al. |
| 7,042,001 | B2 | 5/2006 | Kim et al. |
| 7,067,864 | B2 | 6/2006 | Nishida et al. |
| 7,067,865 | B2 | 6/2006 | Lung |
| 7,122,281 | B2 * | 10/2006 | Pierrat .......................... 430/5 |
| 7,122,824 | B2 | 10/2006 | Khouri et al. |
| 7,126,149 | B2 | 10/2006 | Iwasaki et al. |
| 7,132,675 | B2 | 11/2006 | Gilton |
| 7,166,533 | B2 | 1/2007 | Happ |
| 7,214,958 | B2 | 5/2007 | Happ |
| 7,220,983 | B2 | 5/2007 | Lung |
| 7,277,317 | B2 | 10/2007 | Le Phan et al. |
| 2001/0055838 | A1 | 12/2001 | Walker et al. |
| 2002/0081833 | A1 | 6/2002 | Li et al. |
| 2002/0182835 | A1 | 12/2002 | Quinn |
| 2004/0051094 | A1 | 3/2004 | Ooishi |
| 2004/0248339 | A1 | 12/2004 | Lung |
| 2005/0029502 | A1 | 2/2005 | Hudgens |
| 2005/0093022 | A1 | 5/2005 | Lung |
| 2005/0167656 | A1 | 8/2005 | Sun et al. |
| 2005/0201182 | A1 | 9/2005 | Osada et al. |
| 2005/0212024 | A1 | 9/2005 | Happ |
| 2005/0215009 | A1 | 9/2005 | Cho |
| 2006/0043617 | A1 | 3/2006 | Abbott |
| 2006/0108667 | A1 | 5/2006 | Lung |
| 2006/0110878 | A1 | 5/2006 | Lung et al. |
| 2006/0118913 | A1 | 6/2006 | Yi et al. |
| 2006/0154185 | A1 * | 7/2006 | Ho et al. ..................... 430/330 |
| 2006/0175599 | A1 | 8/2006 | Happ |
| 2006/0226409 | A1 | 10/2006 | Burr et al. |
| 2006/0234138 | A1 | 10/2006 | Fehlhaber et al. |
| 2006/0284157 | A1 | 12/2006 | Chen et al. |
| 2006/0284158 | A1 | 12/2006 | Lung et al. |
| 2006/0284214 | A1 | 12/2006 | Chen |
| 2006/0284279 | A1 * | 12/2006 | Lung et al. .................. 257/528 |
| 2006/0286709 | A1 * | 12/2006 | Lung et al. .................. 438/102 |
| 2006/0286743 | A1 | 12/2006 | Lung et al. |
| 2007/0030721 | A1 | 2/2007 | Segal et al. |
| 2007/0037101 | A1 | 2/2007 | Morioka |
| 2007/0108077 | A1 | 5/2007 | Lung et al. |
| 2007/0108429 | A1 | 5/2007 | Lung |
| 2007/0108430 | A1 | 5/2007 | Lung |
| 2007/0108431 | A1 | 5/2007 | Chen et al. |
| 2007/0109836 | A1 | 5/2007 | Lung |
| 2007/0109843 | A1 | 5/2007 | Lung et al. |
| 2007/0111429 | A1 | 5/2007 | Lung |

| | | | |
|---|---|---|---|
| 2007/0115794 | A1 | 5/2007 | Lung |
| 2007/0117315 | A1 | 5/2007 | Lai et al. |
| 2007/0121363 | A1 | 5/2007 | Lung |
| 2007/0121374 | A1 | 5/2007 | Lung et al. |
| 2007/0126040 | A1 | 6/2007 | Lung |
| 2007/0131922 | A1 | 6/2007 | Lung |
| 2007/0131980 | A1 | 6/2007 | Lung |
| 2007/0138458 | A1 | 6/2007 | Lung |
| 2007/0147105 | A1 | 6/2007 | Lung et al. |
| 2007/0154847 | A1 | 7/2007 | Chen et al. |
| 2007/0155172 | A1 | 7/2007 | Lai et al. |
| 2007/0158632 | A1 | 7/2007 | Ho |
| 2007/0158633 | A1 | 7/2007 | Lai et al. |
| 2007/0158645 | A1 | 7/2007 | Lung |
| 2007/0158690 | A1 | 7/2007 | Ho et al. |
| 2007/0158862 | A1 | 7/2007 | Lung |
| 2007/0161186 | A1 | 7/2007 | Ho |
| 2007/0173019 | A1 | 7/2007 | Ho et al. |
| 2007/0173063 | A1 | 7/2007 | Lung |
| 2007/0176261 | A1 | 8/2007 | Lung |
| 2007/0224726 | A1 | 9/2007 | Chen et al. |
| 2007/0246699 | A1 | 10/2007 | Lung |
| 2007/0257300 | A1 | 11/2007 | Ho et al. |
| 2007/0262388 | A1 | 11/2007 | Ho et al. |

FOREIGN PATENT DOCUMENTS

| | | |
|---|---|---|
| WO | WO 00/79539 A1 | 12/2000 |
| WO | WO 01/45108 A1 | 6/2001 |

OTHER PUBLICATIONS

Adler, D. et al., "Threshold Switching in Chalcogenide-Glass Thin Films," J. Appl/Phys 51(6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Bedeschi, F. et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al. "An Edge Contact Type Cell fro Phase Change RAM Featuring Very Low Power Consumption," 2003 Symposium on VLSI Technology Digest of Technical Papers, pp. 175-176.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

Gibson, G.A. et al., "Phase-change Recording Medium that Enables Ultrahigh-density Electron-beam Data Storage," Applied Physics Letter, 2005, 3 pp. vol. 86.

Happ, T.D. et al., "Novel None-Mask Self-Heating Pillar Phase Change Memory," 2006 Symposium on VLSI Technology, 2 pp.

Hudgens, S. et al., "Overview of Phase-Change Chalcogenide Nonvolatile Memory Technology," MRS Bulletin, Nov. 2004, pp. 829-832.

"Magnetic Bit Boost," www.sciencenews.org <http://www.sciencenews.org>, Dec. 18 & 25, 2004, p. 389, vol. 166.

"New Memories Tap Spin, Gird for Battle," Science News, Apr. 3, 1999, p. 223, vol. 155.

Pirovano, Agostino et al., "Reliability Study of Phase-Change Nonvolatile Memories," IEEE Transactions on Device and Materials Reliability, Sep. 2004, pp. 422-427, vol. 4, No. 3.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Wuttig, Matthias, "Towards a Universal Memory?" Nature Materials, Apr. 2005, pp. 265-266, vol. 4.

Ahn, S. J. et al., "Highly Reliable 5nm Contact Cell Technology for 256Mb PRAM," VLSI Technology, Digest of Technical Papers, Jun. 14-16, 2005, pp. 98-99.

* cited by examiner

SELF-ALIGNED MANUFACTURING METHOD, AND MANUFACTURING METHOD FOR THIN FILM FUSE PHASE CHANGE RAM

PARTIES TO A JOINT RESEARCH AGREEMENT

International Business Machines Corporation, a New York corporation; Macronix International Corporation, Ltd., a Taiwan corporation; and Infineon Technologies A.G., a German corporation, are parties to a Joint Research Agreement.

BACKGROUND OF THE INVENTION

1. Field of the Invention

The present invention relates to fabrication of semiconductor devices, and most specifically to the fabrication of semiconductor devices at sub-lithographic sizes.

2. Description of Related Art

The operation of Moore's Law, which holds that the number of transistors on an integrated circuit will double every 18 months, clearly requires ever smaller devices. As is well known, current fabrication processes are encountering limitations in terms of the smallest devices possible using known techniques. Conventional processes are built around deposition and etching, employing photoresistive etch masks. Generally, layers of materials are deposited and then covered with a photoresistive material. A pattern is projected on the photoresist using visible light, which alters the structure of the photoresist so that unwanted material can be easily removed, and the resulting pattern can be etched into the underlying material.

The smallest feature that can be formed using a given process is referred to as the "minimum feature size." As size requirements have become smaller, however, the need for smaller feature sizes has come up against problems such as the wavelength of light—one cannot resolve objects smaller than the wavelength of the light being used. Wavelengths have been reduced, now extending below the visible spectrum, and substitutes for conventional projection have been adopted.

The art has recognized this problem but has not presented a solution that allows formation of features in the range of 100 nm and less. For example, U.S. Pat. No. 6,744,088, to Dennison, entitled "Phase Change Memory Device on a Planar Composite Layer" discusses the minimum feature size issue and presents a number of possible solutions, including using shorter-wavelength sources for the lithography, such as x-rays, or phase shift masks, or sidewall spacers, all of which suffice down to approximately 100 nm. No solutions below that level are offered, however.

Problems have arisen in manufacturing such devices with very small dimensions, and with variations in process that meets tight specifications needed for large-scale memory devices. It is desirable therefore to provide a memory cell structure having small dimensions and low reset currents, and a method for manufacturing such structure that meets tight process variation specifications needed for large-scale memory devices. It is further desirable to provide a manufacturing process and a structure, which are compatible with manufacturing of peripheral circuits on the same integrated circuit.

SUMMARY OF THE INVENTION

One aspect of the invention is a method for manufacturing a self-aligned narrow structure over a wider structure based on mask trimming. A method for manufacturing a memory device comprises forming an electrode layer on a substrate which comprises circuitry made using front-end-of-line procedures. The electrode layer includes a first electrode and a second electrode, and an insulating member between the first and second electrodes for each phase change memory cell to be formed. A patch of memory material is formed on the top surface of the electrode layer across the insulating member for each memory cell to be formed. The patch and the first and second electrodes are formed using a self-aligned process based on mask trimming.

DETAILED DESCRIPTION

A detailed description of thin film fuse phase change memory cells, arrays of such memory cells, and methods for manufacturing such memory cells, is provided with reference to FIGS. 1-5.

A common sequence in semiconductor fabrication is to deposit a material, either in a single layer or multilayered structure, and then etch that material, either to reduce its lateral extent or to form openings or trenches in the material. In either event, the conventional process for accomplishing those tasks, generally referred to as lithography, involves depositing a layer of resist material, patterning the resist so that the areas to be cut are exposed, and etching the exposed areas to form the chip features desired. As previously noted, conventional technique would call for a different lithographic process for each iteration of patterning and etching. As also discussed above, however, a requirement to form features having dimensions smaller than the minimum feature size of a process poses significant issues for conventional processes.

In addition, conventional technique calls for a new lithography cycle for each etching iteration. Each sequence of patterning and etching is expensive in time and resources.

Figure 1A:
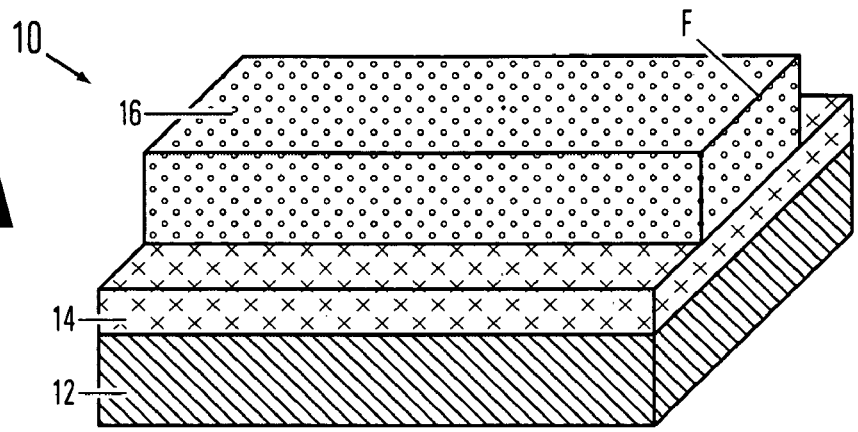
FIGS. 1a-1f illustrate a generalized description of an embodiment of the process of the present invention.
Figure 1B:
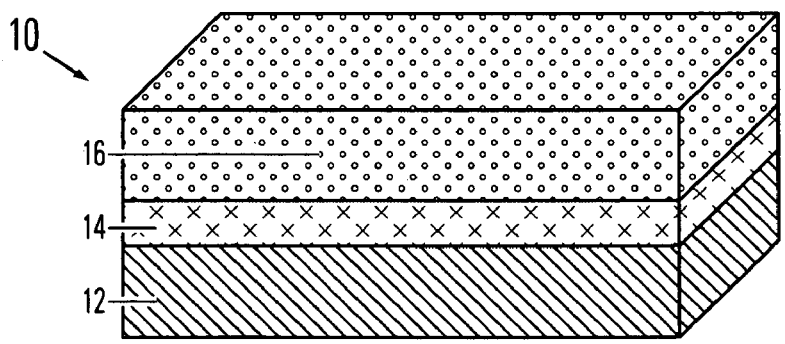

Formation of a feature having at least one critical dimension at less than the minimum feature size of the process is seen in FIGS. 1a-1e. Such features can be referred to as "sub-feature size" or "sub-lithographic". FIG. 1a depicts a structure 10 having two layers, with a first material 12 and second material 14, which have been deposited. For purposes of explanation, it is considered that the first material is required to be reduced to a size about that of the minimum feature size of the lithographic process, which here is about 150 nm. The second material needs to be reduced to a size smaller than that of the first material, to a critical dimension of about 50 nm.

The first reduction step is initiated as seen in FIG. 1a, by depositing and patterning a layer of resist material 16 on the upper surface of the structure 10. It should be understood that the lithographic process seen here can be any of the variety of lithographic processes in common use. Such processes have generally been referred to as "photolithographic", inasmuch as they depended on light in the patterning step, which usually employed a photomask or reticle. Such processes are inherently limited by the wavelength of the light used in the exposure step, however, and attempted improvements have moved away from the use of visible light. Thus, the term "lithography" is employed here as encompassing the range of patterning techniques, using radiation sources extending to wavelengths below the visible spectrum and patterning techniques such as direct patterning, all known in the art.

However the lithographic process is carried out, it produces a resist layer 16 at either the desired dimension or the minimum feature size F, atop the structure 10. It will be noted that, as is typical, the structure of FIG. 1a reflects the photoresist patterning step. The resist material is applied as a layer covering the underlying material; the desired pattern is patterned on the resist material; and excess resist material is removed, exposing those portions of the underlying layer that require further removal. Thus, the resulting resist layer 16 has a smaller size than that of structure 10, as seen in FIG. 1a. In the next step, the resist material serves as a mask for an etching process, which removes material from the structure and leaves it having the same lateral dimensions as does the resist material. A number of etching processes are known in the art, and a suitable process can be selected based on the materials to be etched and the level of control required. The result of the etching process can be seen in FIG. 1b, in which the layers 12 and 14 have been reduced to the lateral dimensions of the resist mask.

At this point, conventional technique would call for the resist material to be stripped, followed by another lithographic step. Here, however, that process does not produce the required results, as the desired dimension for layer 14 is less than the minimum feature size. Instead, the resist layer 16 is trimmed to reduce it to the desired size.

Figure 1C:
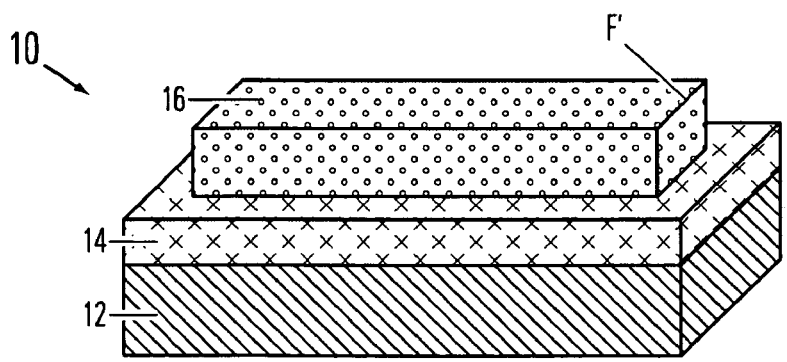

FIG. 1c shows the results of the resist material trim step. As can be seen, resist material 16 is reduced in size by about two-thirds, or in this instance, to about 50 nm, to a size F', less than the minimum feature size F. It is preferred to utilize a dry etching process to accomplish this result, most preferably a dry etching process employing a reactive ion etching (RIE) tool. Dry etching processes are well known in the art, and the use of such processes here proceeds according to principles understood in the art. This etching trims the photoresist isotropically, using an oxide plasma, in both length and width. It is important that whatever process is used exhibit very high selectivity between the second material layer 14 and the resist material 16, to minimize the amount of the second material removed.

Figure 1D:
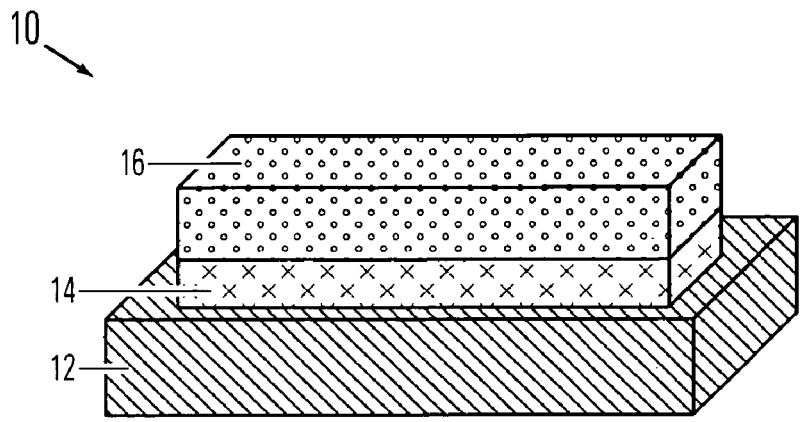
Figure 1E:
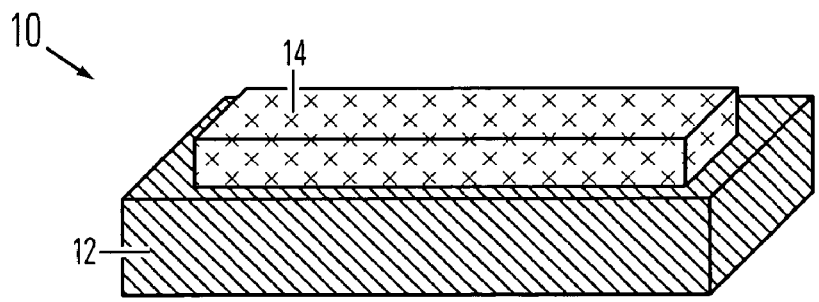
Figure 1F:
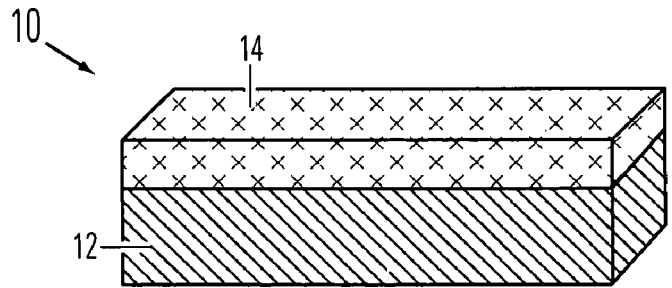

Once the resist material has been trimmed to the desired size, it can perform a mask function in trimming the second material layer to the required size. FIG. 1d depicts the results of that portion of the trimming operation. As can be seen, the second material layer 14 is cut to the width of resist material 16, leaving a relatively narrow structure on the upper surface of first material 12. Stripping the resist material completes the process, as seen in FIG. 1e.

It will be readily understood that the key point of the discussion accompanying FIGS. 1a-1e does not lie in the specific shape formed by the process, but rather the employment of the trim step to enable formation of features at a size hitherto not attainable. For example, a different embodiment of the process could produce the structure of FIG. 1f, which would result if an etching of the entire structure were undertaken after FIG. 1c. That embodiment produces a multi-layer sub-lithographic structure, and other variations will be clear to those in the art. Moreover, the process according to the present invention also results in the elimination of a lithography cycle, resulting in reduced cycle time and cost.

In either event, the final etching process should meet several criteria. First, the process should be anisotropic, as it needs to remove material layers without undercutting the resist material. It should also have good selectivity between the layer materials and resist material. And the process should be highly controllable, in order to achieve the tolerances required. The criteria can be met within the knowledge of those in the art.

Application of this process to an integrated circuit is shown in FIGS. 2-5. Each of those drawings is a pair of schematic diagrams (e.g., FIGS. 2a and 2b), showing frontal and plan views of an integrated circuit, here a portion of a random access memory cell 100, employing the process set out above. As seen in FIGS. 2a and 2b, the lower portion of this structure is a base structure 101 well-known in the art, having a substrate 102 capped with dielectric fill material 104. A common source line 110 runs through the center of the cell, and two electrode plug elements 108 extend upward from the substrate on either side of the source line. Two word lines 106 also pass through the cell, generally in a direction perpendicular to the drawing surface shown. While the elements shown here form the context of an embodiment of the invention, various other structures could equally well be used. Those of skill in the art will understand this structure and the alternatives thereto.

The process will further be illustrated showing the formation of the electrode layer of a phase change memory cell. The phase change memory cell itself is discussed more fully in U.S. patent application Ser. No. 11/155,067, entitled "Thin Film Fuse Phase Change Ram and Manufacturing Method", which patent application is hereby incorporated by reference herein.

Figure 2A:
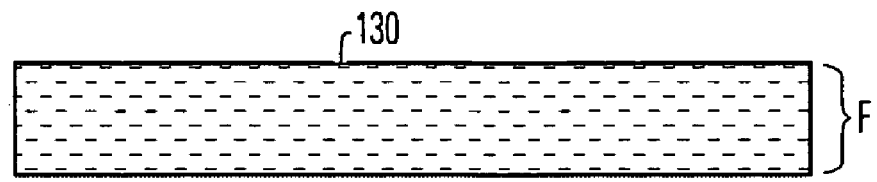
FIGS. 2a and 2b illustrate an initial step of an embodiment of a process of the present invention.
Figure 2B:
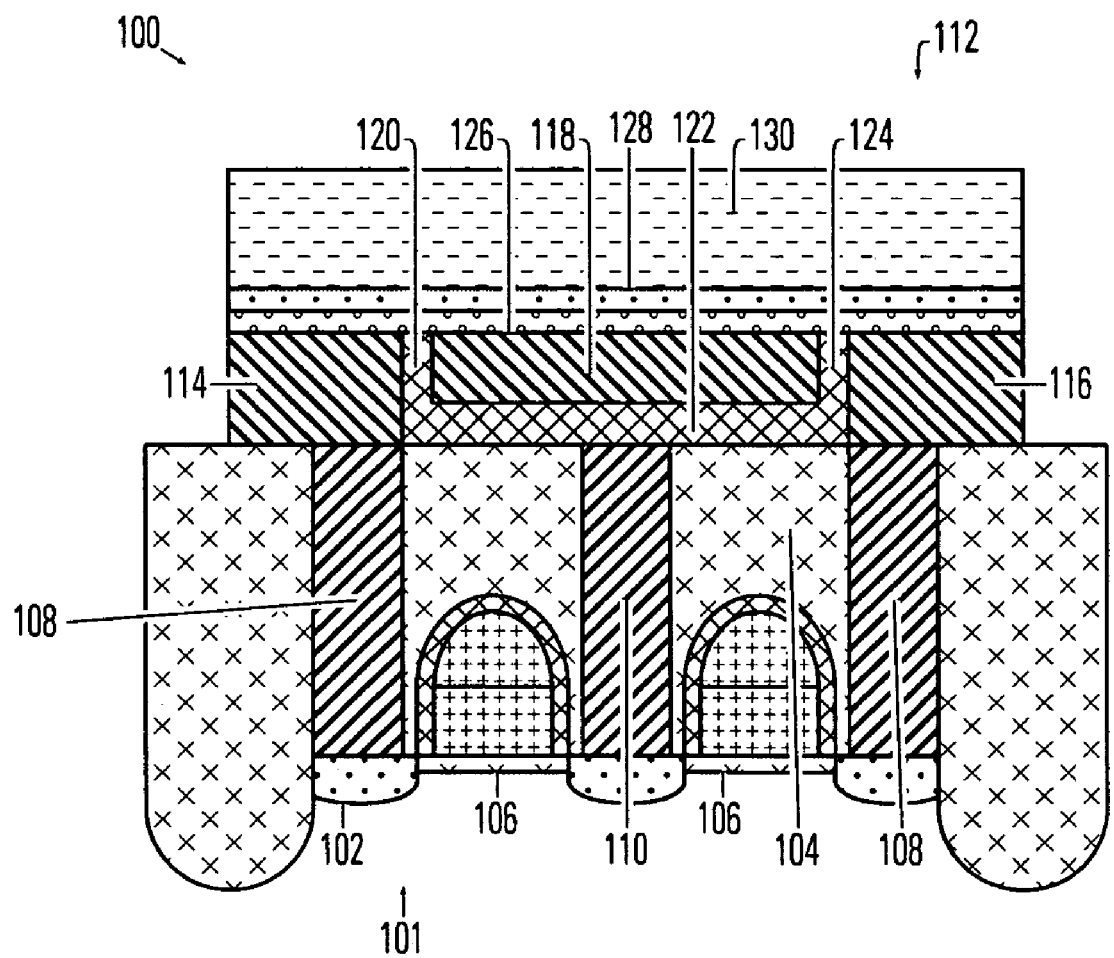

As seen in FIG. 2b, the electrode layer 112 includes electrode members 114, 116 and 118, which are separated from one another by an insulating member including fences 120 and 122, and base member 124. The base member 124 can be thicker than the fences 120, 122 in embodiments of the structure, and separates the electrode member 118 from the common source line 110. For example, the base member can be for instance, 80 to 140 nm thick while the fences are much narrower, as needed to reduce capacitive coupling between the source line 110 and the electrode member 118. The fences 120 and 122 comprise a thin film dielectric material on the sidewalls of electrode members 114 and 116 in the illustrated embodiment, with a thickness at the surface of the electrode layer 112 determined by the thin film thickness on the sidewalls.

The electrode members 114, 116 and 118 can be composed of any of the known materials that exhibit properties including good electrical conductivity and workability. It is also helpful if the material can act as a diffusion barrier regarding the phase change material. In one embodiment, it is preferred to use TiN for these elements. Similarly, the insulating members 120, 122 and 124 are formed from SiN in one embodiment. The specific materials and their alternatives for these elements are discussed in some detail in the '067 application referred to above, as are the fabrication techniques for forming them.

Over the electrode member/insulating member structure are formed layers of phase change material 126, a dielectric cap layer 128 and a etch mask layer 130. The dielectric cap material 128 is preferably $SiO_2$. The etch mask layer is preferably a photoresist material, well-known in the art. As can be seen in the top view, FIG. 2a, the photoresist material completely covers the underlying layers. The width of the photoresist (that is, the dimension transverse to the long axis of the cell) is formed at the minimum feature size F permitted by the fabrication process. Here that dimension is about 150 nm. The phase change material layer can have a thickness, in one embodiment of the invention, between about 10 nm and 50 nm, most preferably about 30 nm. It should also be noted that FIG. 2a also depicts the results of the anisotropic etching of material exposed by the photoresist.

The phase change materials in some embodiments of the memory cell 100 include phase change-based memory materials, including chalcogenide based materials and other materials, for the phase change element 126. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols. 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states.

Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including $N_2$ doped GST, $Ge_xSb_y$, or other material that uses different crystal phase changes to determine resistance; $Pr_xCa_yMnO_3$, PrSrMnO, $ZrO_x$, or other material that uses an electrical pulse to change the resistance state; TCNQ, PCBM, TCNQ-PCBM, Cu-TCNQ, Ag-TCNQ, C60-TCNQ, TCNQ doped with other metal, or any other polymer material that has bistable or multi-stable resistance state controlled by an electrical pulse.

Figure 3A:
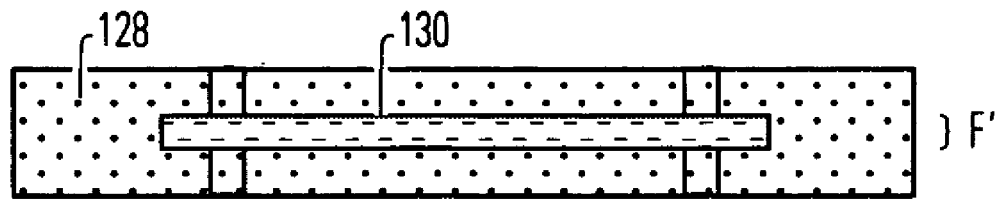
FIGS. 3a and 3b illustrate a further step of an embodiment of a process of the present invention.
Figure 3B:
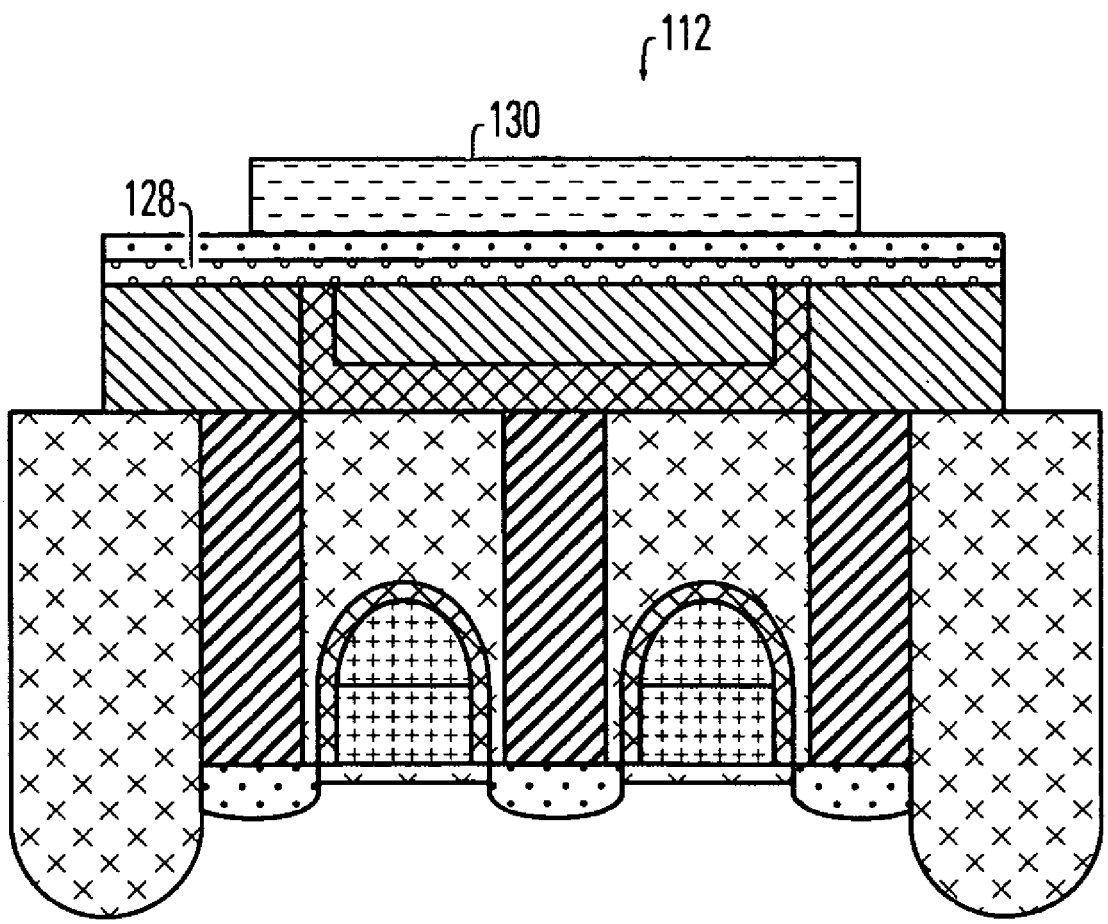

FIGS. 3a and 3b show the effects of the photoresist trim step. As seen there, the photoresist has been subjected to a trim in both lateral directions, cutting its width (transverse to the long axis of the cell) to about 50 nm, a size F' less than the minimum feature size, and reducing its length to a length less than that of the underlying cell. The requirements for this step include high selectivity and controllability, which generally points to a dry etching process.

Figure 4A:
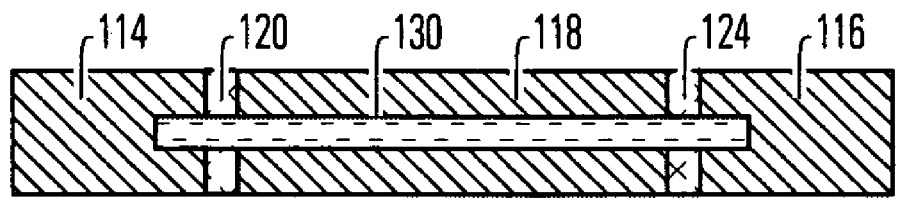
FIGS. 4a and 4b illustrate a further step an embodiment of a process of the present invention.
Figure 4B:
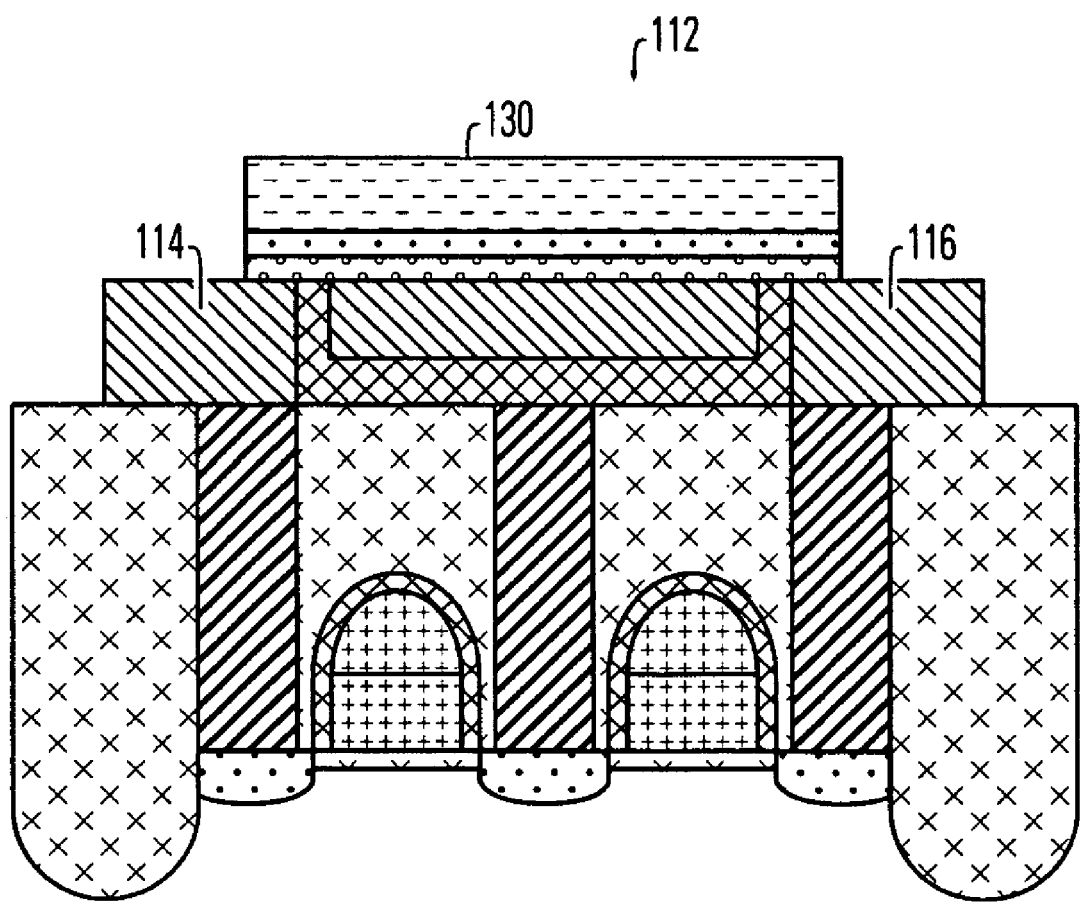

The next step employs the trimmed photoresist as an etch mask, with results as seen in FIGS. 4a and 4b. There, the etching step removes material exposed by the photoresist trim, etching away the dielectric cap and phase change material layers, down to the TiN layer 114/118/116. This etching step should be anisotropic, to avoid undercutting the phase change material, and it should exhibit high selectivity between the photoresist and the dielectric/phase change materials. For one embodiment, it is preferred to employ reactive ion etching (RIE). Suitable chemistries include $O_2$ and F or other chemistries as known in the art.

Figure 5A:
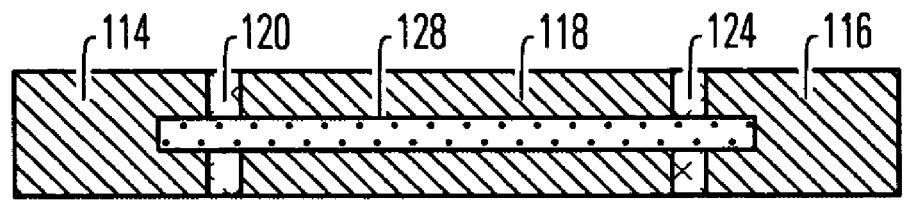
FIGS. 5a and 5b illustrate a further step an embodiment of a process of the present invention.
Figure 5B:
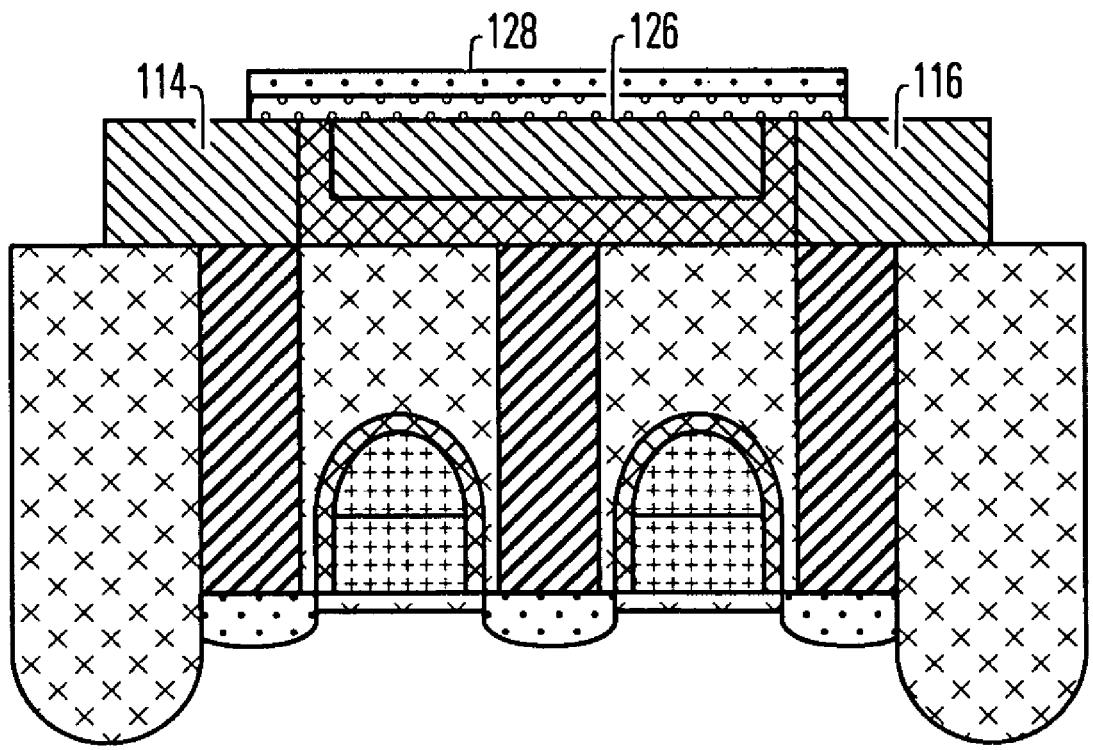

Finally, as seen in FIGS. 5a and 5b, the photoresist is removed. It is preferred to strip the photoresist, rather than leaving it in place, as the polymer material of the photoresist can be degraded in subsequent steps, producing organic waste material that can be difficult to deal with. The preferred stripping method employs $O_2$ plasma, which can be followed by a wet-strip using a suitable solvent, such as EKC265, to assist.

The resulting structure presents a layer of phase change material 126 and a dielectric cap 126 having as its width a sub-lithographic dimension of about 50 nm. The cell structure is prepared for further fabrication steps as outlined in the '067 patent application cited above.

Those with skill in the art will recognize that a number of variations can be applied to the process set out above. The process is by no means limited to the structure set out, but it can be adapted to any design in which a requirement exists to fabricated features at a sub-lithographic dimension. This and other variations can be implemented by those in the art without departing from the spirit of the invention, as set out and defined in the claims appended hereto.

The invention claimed is:

1. A method for manufacturing a structure on an integrated circuit, comprising:
   forming a first layer of material having a top surface;
   forming a second layer of material over the top surface of the first layer;
   applying an etch mask over the second layer, the etch mask defining a pattern for a first structure to be formed from the first layer of material;
   etching the second layer of material and the first layer of material according to the etch mask, leaving the first structure in the first layer of material having a first width, and a portion of the second layer of material over the first structure;
   trimming the etch mask to formed a trimmed etch mask, the trimmed etch mask defining a more narrow pattern for a second structure to be formed from the second layer of material over the first structure; and
   etching the second layer of material according to the more narrow etch mask to form the second structure, the second structure having a second width that is less than the first width, and being self-centered over the first structure.

2. The method of claim 1, wherein the etch mask comprises photoresist.

3. The method of claim 1, wherein the etch mask comprises photoresist, and said trimming comprises isotropically etching the photoresist.

4. The method of claim 1, wherein said applying an etch mask comprises using a photolithographic process having a minimum feature size F, to define an etch mask with a width about equal to F, and wherein the trimmed etch mask has a width less than F.

5. The method of claim 1, wherein said first layer of material comprises an electrode layer having a top surface, the electrode layer including a first electrode member and a second electrode member, and an insulating member between the first and second electrode members, and wherein the first and second electrode members, and the insulating member extend to the top surface of the electrode layer, and the insulating member has a width between the first and second electrode members at the top surface.

6. The method of claim 1, wherein said first layer of material comprises a film of memory material on the top surface of the first layer, and a protective cap layer on the film of memory material.

7. A method for manufacturing a memory device, comprising:
   forming an electrode layer having a top surface, the electrode layer including a first electrode member and a second electrode member, and an insulating member between the first and second electrode members, and wherein the first and second electrode members, and the insulating member extend to the top surface of the electrode layer, and the insulating member has a width between the first and second electrode members at the top surface;
   forming a film of memory material on the top surface of the electrode layer across the insulating member, the film of memory material having a first side and a second side and contacting the first and second electrode members on the first side;
   applying an etch mask over the film of memory material, the etch mask defining a pattern for a first electrode and a second electrode to be formed from the first and second electrode members;
   etching the film of memory material and the electrode layer according to the etch mask;
   trimming the etch mask to formed a trimmed etch mask, the trimmed etch mask defining a more narrow pattern for a patch of memory material over the first and second electrodes; and
   etching the film of memory material according to the more narrow etch mask to form the patch aligned with the first and second electrodes, the patch defining an inter-electrode path between the first and second electrodes across the insulating member having a path length defined by the width of the insulating member, wherein the memory material has at least two solid phases.

8. The method of claim 7, wherein the width of the insulating member is less than 50 nm, said forming a patch includes forming the film with a thickness less than 50 nm in a dimension orthogonal to the top surface of the electrode layer.

9. The method of claim 7, wherein said forming a patch includes forming the film with a thickness less than 20 nm in a dimension orthogonal to the top surface of the electrode layer.

10. The method of claim 7, wherein said forming an electrode layer includes:
    forming a dielectric layer on a substrate;
    forming a first conductive layer on the dielectric layer;
    etching a pattern in the first conductive layer, the pattern including regions between the stacks exposing the substrate, and stacks on the substrate including remaining portions of the dielectric layer and remaining portions of the first conductive layer, the stacks having sidewalls;
    forming a sidewall dielectric layer over the stacks and etching the sidewall dielectric layer to form sidewall spacers on the sidewalls of the stacks;
    forming a second conductive layer over the regions between the stacks, the sidewall spacers and the stacks;
    etching and planarizing the second conductive layer to define the electrode layer, wherein the sidewall spacers are exposed on the top surface and act as the insulating member, portions of the first conductive layer in the stacks are exposed on the top surface and act as the first electrode, and portions of the second conductive layer in the regions between the stacks are exposed on the top surface and act as the second electrode.

11. The method of claim 10, wherein said etching and planarizing comprises chemical mechanical polishing.

12. The method of claim 7, including forming said electrode layer on a surface of a substrate, the substrate comprising circuitry for accessing the memory cell, including a contact on the surface of the substrate, and said second electrode in the electrode layer is coupled to the contact.

13. The method of claim 7, including forming a patterned conductive layer over said patch, and forming a contact between said first electrode and said patterned conductive layer.

14. The method of claim 7, wherein the memory material comprises an alloy including a combination of Ge, Sb, and Te.

15. The method of claim 7, wherein the memory material comprises an alloy including a combination of two or more materials from the group of Ge, Sb, Te, Se, In, Ti, Ga, Bi, Sn, Cu, Pd, Pb, Ag, S, and Au.

* * * * *